US008591659B1

(12) United States Patent
Fang et al.

(10) Patent No.: US 8,591,659 B1
(45) Date of Patent: Nov. 26, 2013

(54) PLASMA CLEAN METHOD FOR DEPOSITION CHAMBER

(75) Inventors: Zhiyuan Fang, West Linn, OR (US); Pramod Subramonium, Beaverton, OR (US); Jon Henri, West Linn, OR (US); Keith Fox, Portland, OR (US)

(73) Assignee: Novellus Systems, Inc., Fremont, CA (US)

( * ) Notice: Subject to any disclaimer, the term of this patent is extended or adjusted under 35 U.S.C. 154(b) by 323 days.

(21) Appl. No.: 12/355,601

(22) Filed: Jan. 16, 2009

(51) Int. Cl.
   *B08B 9/08* (2006.01)

(52) U.S. Cl.
   USPC .............. 134/1.1; 134/26; 134/22.1; 438/905; 216/67

(58) Field of Classification Search
   USPC ................ 134/1.1, 22.1, 30; 438/905; 216/67
   See application file for complete search history.

(56) References Cited

U.S. PATENT DOCUMENTS

| | | | |
|---|---|---|---|
| 4,787,957 A | 11/1988 | Barkanic et al. | |
| 5,160,402 A | 11/1992 | Cheng | |
| 5,326,723 A | 7/1994 | Petro et al. | |
| 5,413,670 A | 5/1995 | Langan et al. | |
| 5,454,903 A | 10/1995 | Redeker et al. | |
| 5,788,778 A | 8/1998 | Shang et al. | |
| 5,846,373 A | 12/1998 | Pirkle et al. | |
| 5,888,337 A | 3/1999 | Saito | |
| 5,986,747 A | 11/1999 | Moran | |
| 6,060,397 A | 5/2000 | Seamons et al. | |
| 6,067,999 A | 5/2000 | Hines et al. | |
| 6,124,927 A | 9/2000 | Zhong et al. | |
| 6,274,058 B1 * | 8/2001 | Rajagopalan et al. | 216/67 |
| 6,305,390 B1 * | 10/2001 | Jeon | 134/1.1 |
| 6,492,186 B1 | 12/2002 | Han et al. | |
| 6,534,007 B1 | 3/2003 | Blonigan et al. | |
| 6,547,458 B1 | 4/2003 | Janos et al. | |
| 6,569,257 B1 | 5/2003 | Nguyen et al. | |
| 6,716,765 B1 * | 4/2004 | Hanprasopwattana et al. | 438/714 |
| 6,767,836 B2 | 7/2004 | San et al. | |
| 7,381,644 B1 * | 6/2008 | Subramonium et al. | 438/671 |
| 7,479,191 B1 | 1/2009 | Entley et al. | |
| 2001/0050143 A1 | 12/2001 | Crocker | |
| 2003/0005943 A1 * | 1/2003 | Singh et al. | 134/1.1 |
| 2004/0045577 A1 | 3/2004 | Ji et al. | |
| 2004/0144400 A1 | 7/2004 | Satoh et al. | |
| 2004/0261815 A1 | 12/2004 | Pavone | |
| 2005/0082001 A1 * | 4/2005 | Sugiura | 156/345.28 |
| 2005/0161060 A1 | 7/2005 | Johnson et al. | |
| 2006/0027249 A1 * | 2/2006 | Johnson et al. | 134/1.1 |
| 2006/0054183 A1 | 3/2006 | Nowak et al. | |
| 2006/0157448 A1 * | 7/2006 | Magni et al. | 216/67 |
| 2007/0006893 A1 | 1/2007 | Ji | |
| 2009/0297731 A1 * | 12/2009 | Goundar | 427/577 |

FOREIGN PATENT DOCUMENTS

WO   WO 2007/097822   8/2007

OTHER PUBLICATIONS

U.S. Appl. No. 11/112,741, Office Action mailed Jul. 31, 2008.
U.S. Appl. No. 11/112,741, Notice of Allowance mailed Nov. 14, 2008.
Entley et al., "Optimizing utilization efficiencies in electronegative discharges: the importance of the impedance phase angle", Journal of Applied Physics, vol. 86, No. 9, Nov. 1, 1999, pp. 4825-4835.
Vitale, et al. "Etching chemistry of benzocyclobutene (BCB) low-κ dielectric films in $F_2+O_2$ and $Cl_2+O_2$ high density plasmas", J. Vac. Sci. Technol. A, vol. 18, No. 6, Nov./Dec. 2000, pp. 2770-2778.
U.S. Appl. No. 11/112,742, "CVD chamber cleans following ultra low-K treatments", Entley et al., filed Apr. 22, 2005.
U.S. Appl. No. 11/112,742, Office Action mailed May 15, 2007.
U.S. Appl. No. 11/112,742, Office Action mailed Oct. 2, 2007.
U.S. Appl. No. 12/030,145, "Methods and apparatus for cleaning deposition reactors", Wongsenakhum et al., filed Feb. 12, 2008.
U.S. Appl. No. 11/612,382, "Methods of improving ashable hardmask adhesion to metal layers", Fang et al., filed Dec. 18, 2006.
U.S. Appl. No. 12/030,145, Office Action mailed Sep. 17, 2010.
U.S. Appl. No. 12/030,145, Office Action mailed Apr. 20, 2011.

* cited by examiner

Primary Examiner — Michael Kornakov
Assistant Examiner — Natasha Campbell
(74) Attorney, Agent, or Firm — Weaver Austin Villeneuve & Sampson LLP

(57) ABSTRACT

Improved methods and apparatuses for removing residue from the interior surfaces of the deposition reactor are provided. The methods involve increasing availability of cleaning reagent radicals inside the deposition chamber by generating cleaning reagent radicals in a remote plasma generator and then further delivering in-situ plasma energy while the cleaning reagent mixture is introduced into the deposition chamber. Certain embodiments involve a multi-stage process including a stage in which the cleaning reagent mixture is introduced at a high pressure (e.g., about 0.6 Torr or more) and a stage the cleaning reagent mixture is introduced at a low pressure (e.g., about 0.6 Torr or less).

16 Claims, 5 Drawing Sheets

US 8,591,659 B1

PLASMA CLEAN METHOD FOR DEPOSITION CHAMBER

FIELD OF THE INVENTION

The present invention relates generally to methods and apparatuses for cleaning deposition chambers and more specifically to methods and apparatuses for cleaning residues from interior surfaces of deposition chambers using plasmas.

BACKGROUND OF THE INVENTION

Deposition of thin films is one of the key processes in semiconductor manufacturing. A typical wafer goes through deposition of several thin films, some of which may completely or partially remain in the final electronic device, while others may only temporarily remain on the wafer and serve some intermediate processing needs. For example, an ashable hard mask film may be used as an etch hardmask layer. Such film is first deposited on a wafer and then partially removed to define circuit line patterns. An etchant is then applied to remove some of the underlying dielectric forming trenches and vias for the future circuit lines. Eventually, all remaining ashable hard mask film is removed from the wafer.

Various deposition processes are used to deposit thin films. For example, an ashable hard mask film may be deposited using chemical vapor deposition (CVD), or more specifically plasma enhanced chemical vapor deposition (PECVD), processes. One consequence of almost any deposition process is that the film material is not only deposited onto the wafer but also on the interior surfaces of the deposition chambers, thereby forming residues. These residues can build up over time and dissolve, detach or otherwise disperse through the deposition chamber causing contamination. The built-up residues are periodically removed to avoid such contamination.

SUMMARY

Provided are plasma cleaning methods for removing residues that have accumulated on the interior surfaces of deposition chambers. Provided also are apparatuses for executing the presented cleaning methods. The plasma cleaning methods involve generating cleaning reagent activated species in a remote plasma generator to form a cleaning reagent mixture and then introducing the mixture into a deposition chamber. Activated species within the mixture etch the deposition residue, forming removable etch byproducts that can be pumped away from the chamber. At the same time, in-situ RF plasma is provided by applying RF power to the clean mixture from a plasma RF generator. The in-situ RF plasma dissociates and activates cleaning reagent molecules that have not dissociated or activated while passing through the remote plasma generator or that have recombined from the activated species along the distribution path from the remote plasma generator to the deposition chamber. The additional activated species supplied by the in-situ RF plasma from this cleaning method provide improved cleaning efficiency.

In certain embodiments, the method of cleaning residues from the interior surfaces of a chamber includes introducing one or more cleaning reagents into a remote plasma generator and generating activated species from the cleaning reagents in the remote plasma generator by delivering first plasma energy to the cleaning reagents. The activated species become a part of a cleaning mixture that is introduced into the deposition chamber. The interior surfaces of the deposition chamber are exposed to the cleaning mixture while an in-situ plasma generator delivers second plasma energy to the cleaning reagents for at least one period of time. In certain embodiments, the second plasma energy generates additional activated species inside the deposition chamber. In the same or other embodiments, the second plasma energy re-dissociates recombined molecules to form radicals. The residue reacts with the cleaning mixture to form volatile products to be removed from the deposition chamber. The residue may include carbon, silicon oxide, or other components. In certain embodiments, the residue is formed during deposition of an ashable hard mask film.

Generation of the activated species may include forming radicals. In certain embodiments, the cleaning reagents include an oxygen containing compound and a fluorine containing compound. For example, the cleaning reagents may include oxygen and nitrogen trifluoride. The pedestal of the deposition chamber may be kept between about 250 and 550 degrees Centigrade while the residue is reacting with the cleaning mixture.

The cleaning method may include two stages. For example, introducing the cleaning mixture into the deposition chamber, exposing the interior surfaces of the deposition chamber to the cleaning mixture and reacting the residue with the cleaning mixture may be performed at a chamber pressure of at least about 0.6 Torr during the first stages and no more than about 0.6 Torr during the second stage. In certain embodiments, the first stage is performed prior to the second stage. The second plasma energy during the first stage may be less than the second plasma energy during the second stage. In certain embodiments, the second plasma energy is delivered at between about 1,000 W and 2,000 W during the first stage and at between about 2,000 W and 3,000 W during the second stage. In the embodiments where the cleaning reagents comprise an oxygen containing compound and a fluorine containing compound, the oxygen containing compound has a flow rate of at least ten times greater than a flow rate of the fluorine containing compound during the first stage and at least three times greater during the second stage. The etch rate of the carbon containing residue around on a pedestal surface kept at least 150 degrees Centigrade is at least 1 micron per minute during the first stage.

The cleaning method may also include a third stage that involves introducing one or more cleaning reagents into the remote plasma generator, generating the activated species from the cleaning reagents in the remote plasma generator by delivering the first plasma energy to the cleaning reagents, introducing the cleaning mixture comprising the activated species into the deposition chamber, exposing the interior surfaces of the deposition chamber to the cleaning mixture, and reacting the residue with the cleaning mixture to form volatile products to be removed from the deposition chamber. The cleaning reagents during the third stage may include a fluorine containing compound. The third stage may be shorter than the second stage. In certain embodiments, the in-situ plasma generator is turned off during the third stage.

In certain embodiments, cleaning of the residue is performed by semiconductor apparatus that includes a semiconductor process chamber configured to generate an in-situ plasma within the chamber, a remote plasma generator, and a controller with program instructions for introducing one or more cleaning reagents into the remote plasma generator, generating activated species from the cleaning reagents in the remote plasma generator by delivering a first plasma energy to the cleaning reagents, introducing a cleaning mixture into the deposition chamber, wherein the cleaning mixture comprises the activated species, exposing the interior surfaces of the deposition chamber to the cleaning mixture while delivering a second plasma energy in-situ; and reacting the residue with the cleaning mixture to form volatile products to be removed from the deposition chamber.

DETAILED DESCRIPTION OF A PREFERRED EMBODIMENT

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.
Introduction Thin film deposition usually causes some residue to accumulate on the inside surfaces of deposition chambers. For example, a typical chemical vapor deposition (CVD) process involves distributing precursor gases through a shower head and directing the gases towards the wafer's surface. The wafer normally is positioned on a heated pedestal to stimulate the deposition process. An in-situ plasma may be used to energize and dissociate precursor molecules making them more reactive. However, not all precursor materials react and end up being deposited on wafer. Some are pumped out of the chamber, while other may be deposited on the inside surfaces, including a showerhead, a top plate, chamber walls, and other remote areas and surfaces of the chambers. Over time these residues need to be removed to avoid contamination.

Cleaning methods involve introducing cleaning reagents into the deposition chamber that react with residue and form volatile products, which are then pumped out of the chamber. To expedite the cleaning process, the reagents may be activated in a plasma generator to form a more reactive cleaning mixture. Activating chemical species may include energizing them bringing them to a higher energy state, dissociating them into radicals and forming reactive atoms and ions. Cleaning efficiency may also be improved by heating up the cleaning mixture and surfaces containing residues because many residue materials do not readily react at low temperatures or may form non-volatile substances that must be later mechanically removed in a slow and laborious process. For example, high carbon content ashable hard mask materials may be etched with activated oxygen and fluorine species. However, when temperature drops below 100° C., carbon is essentially non-reactive with oxygen, while it may form non-volatile polymer substances with fluorine. While the cleaning reagent mixture may include high energy molecules, activated atoms and ions are primarily responsible for etching the residue.

Figure 1A:
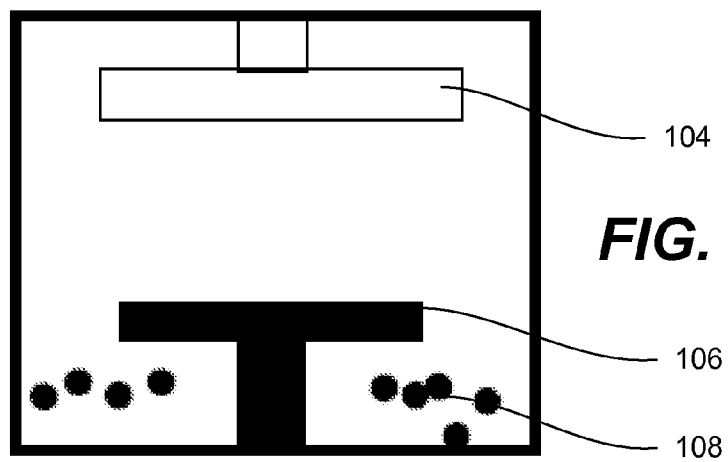
FIGS. 1A-1C illustrate distribution of remaining residues inside the deposition chambers after the chambers have been cleaned using three different cleaning methods.
Figure 1B:
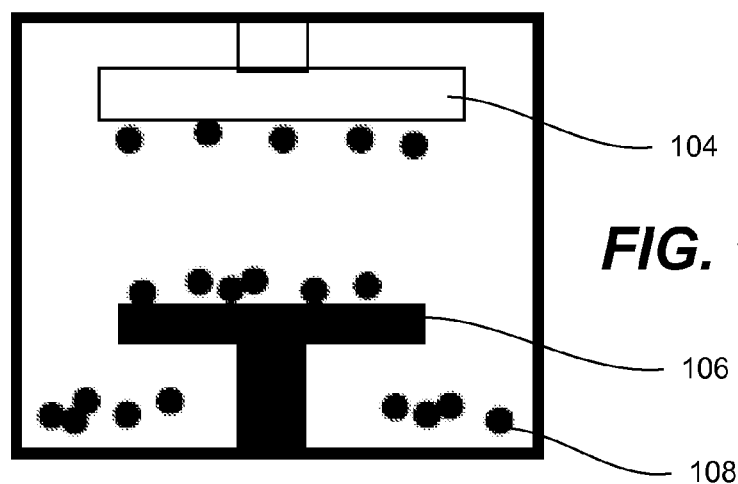

According to various embodiments, cleaning reagents may be dissociated or otherwise activated both externally in a remote plasma generator, such as a Remote Plasma Cleaning (RPC) unit, and inside the deposition chamber using an in-situ plasma generator. Cleaning methods using a remote plasma generator are less damaging to the deposition equipment but may not provide adequate cleaning by leaving substantial amounts of residue 108 as shown in FIGS. 1A and B in comparison with a substantially clean chamber shown in FIG. 1C. FIG. 1A illustrates a chamber including a shower head 104 and a pedestal 106 after remote plasma cleaning using fluorine containing cleaning reagents in the absence of oxygen radicals. FIG. 1B shows a similar chamber after remote plasma cleaning using cleaning reagents that only contain oxygen radicals. The remote plasma generator provides high degree of activation of cleaning reagents, but many of theses activated species then go back to their neutral state before reaching the residue on the internal surfaces of the chamber. For example, oxygen radicals are particularly prone to recombination along the distribution path and easily form oxygen molecules that are not sufficiently reactive to remove carbon residues. As a result, the amount of residue 108 left after cleaning is typically greater in a chamber cleaned with cleaning reagents including only oxygen radicals as shown in FIG. 1B than in the chamber cleaned with fluorine containing cleaning reagents as shown in FIG. 1A. Usually, the wafer pedestal 106 and the shower head 104 are cleaned more effectively with fluorine containing cleaning reagents. However, fluorine may be also damaging to the chamber at high concentration. In the absence of oxygen radicals, fluorine radicals can react with carbon residue on cold interior surfaces and form non volatile etch products which are difficult to remove. Combining oxygen and fluorine containing cleaning reagents together in a remote plasma unit improves the etch efficiency by generating more reactive etch species inside the remote plasma unit itself, and reduces recombination loss of reactive species during the transportation from the unit to the chamber. However, in many cases, the improvement is still not sufficient to remove the entire residue from the chamber. For example, the reactive oxygen radicals may recombine before reaching the chamber.

Figure 1C:
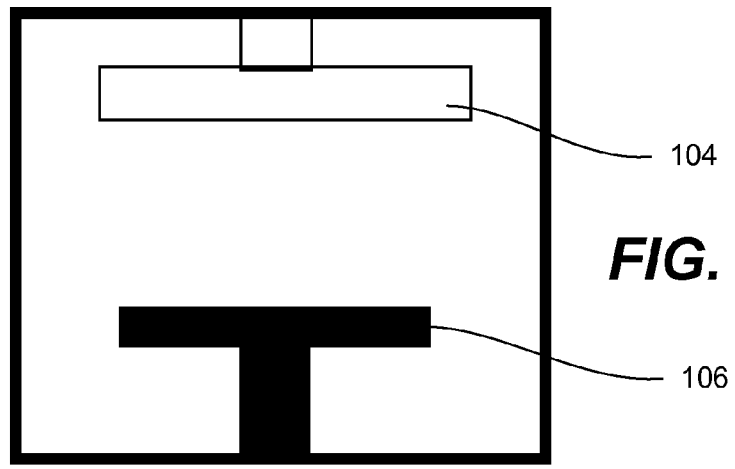

An in-situ plasma cleaning method is another method to remove residues from the deposition chamber as shown in FIG. 1C. The activation of cleaning reagents happens inside the deposition chamber and is provided by in-situ plasma. While the degree of activation for the in-situ plasma method, for example measured by dissociation, is much less than for remote plasma cleaning (approximately 50% for in-situ plasma as compared to more than 90% for remote plasma cleaning), in-situ dissociation occurs near residue surfaces and recombination effect is minimal if any. Additionally, the in-situ plasma helps to heat up chamber surfaces leading to higher etch rate of removing process. As a result, residue removal is complete, or much higher than for the remotely generated plasma cleans described above with respect to FIGS. 1A and 1B.

Increasing energy delivered by in-situ plasma generators improves cleaning effectiveness; however, there is a trade off between the amount of energy and damage to the components directly exposed to the in-situ plasma. The internal components experience continuous ion bombardment that increases with the level of plasma energy used and may result in rapid deterioration of these components. In particular, the shower head 104 may be damaged due to fast aluminum fluoride layer growth at elevated temperature and RF power levels, which may be required for high etching rates during cleaning. Aluminum fluoride layer can delaminate from showerhead surface and cause particle contamination.

The methods described herein provide effective cleaning without damaging the internal components. These methods involve generating activated species from the cleaning reagents in a remote plasma generator to form a cleaning mixture and introducing the mixture into a deposition chamber that generates in-situ plasma. The plasma cleaning method takes advantage of high degree of dissociation of the remote plasma generator and localized activation of the clean species in the mixture near residue surfaces by in-situ plasma. As described below, experimental results indicate more effective cleaning (higher etch rates) for the new methods.

Process

Figure 2:
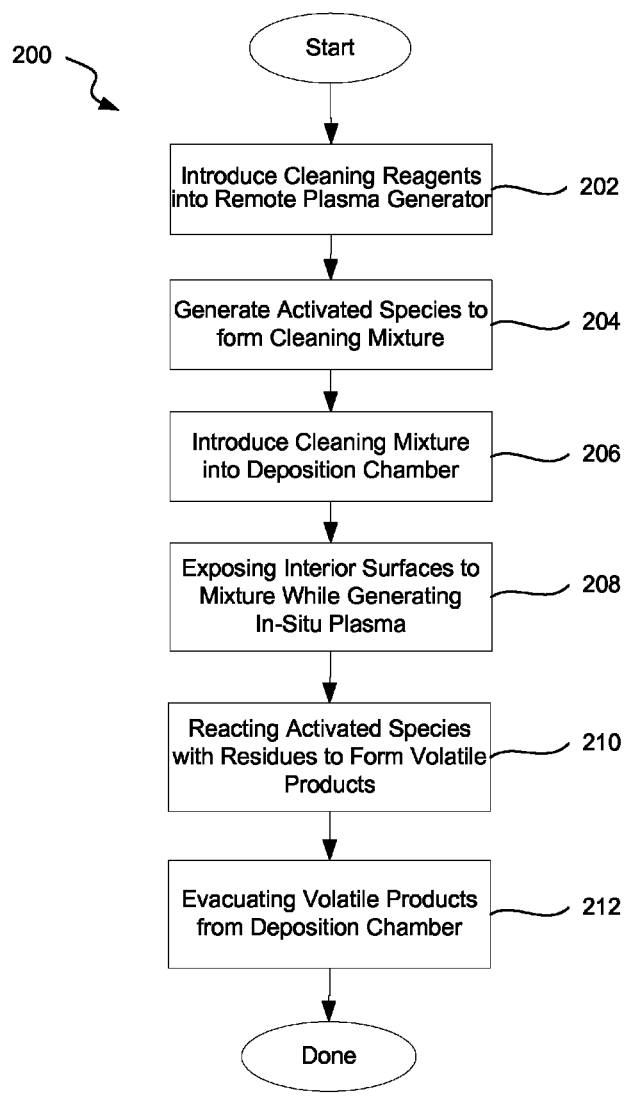
FIG. 2 illustrates a process flowchart of a plasma cleaning method for removal of residues from the inside surfaces of deposition chambers in accordance with one embodiment of the present invention.

FIG. 2 illustrates a process flowchart of a plasma cleaning method in accordance with the present invention. Usually, a chamber having residues from thin film depositions on its interior surfaces is provided. For example, the provided chamber may have residue formed from depositing ashable hard mask films having a thickness of between about 2,000 and 10,000 Angstroms on 30-150 wafers. Any chamber having in-situ cleaning capabilities, i.e. in which plasma can be struck, can be cleaned using the described cleaning method. In one embodiment, a deposition chamber may be a PECVD chamber. In more specific embodiment, the chamber may be a Vector PECVD chamber, or a Vector Extreme PECVD chamber, both manufactured by Novellus Systems in San Jose, Calif. A Remote Plasma Cleaning (RPC) unit is connected to the deposition chamber so that clean species can be transported into the chamber. A chamber may have a dedicated cleaning apparatus or may share the same cleaning apparatus among several other deposition chambers. Additional details of the deposition chamber and the cleaning apparatus are provided in the context of FIG. 4.

The process continues with introducing cleaning reagents into the remote plasma generator unit (block 202). Selection of the cleaning reagents normally depends on residue composition, which typically corresponds to composition of deposited films. For example, deposition of ashable hard mask film may lead to formation of residue comprising carbon, hydrogen, nitrogen and other components. In a specific embodiment, the residue may contain more than 60% and even more than 80% of carbon. The cleaning reagents for this example may include oxygen containing compounds, such as oxygen, ozone, nitrous oxide, carbon oxide, carbon dioxide, and other oxidizers, and fluorine containing compounds, such as nitrogen trifluoride, fluorine, tetrafluoromethane, tetrafluoroethylene, hexafluoroethane, octafluoropropane and others. Ashable hard mask residue may also have underlying residues comprising silicon oxide formed during dielectric deposition. Fluorine containing cleaning reagents are effective to remove silicon containing residues because etch product, i.e., silicon fluoride, is volatile and can be easily pumped out of the chamber. Thus, a combination of oxygen and fluorine containing clean reagents not only works for etching of ashable hard mask films, but also can be used for cleaning residues left after depositing silicon containing dielectric films, such as silicon oxide, low-K films, silicon nitride, silicon oxynitride, and others. Cleaning of many residues may be substantially improved by having higher relative concentration of activated cleaning species near the surface of residues. Residues may be cleaned individually or in combination with other residues.

Flow rates of the cleaning reagents typically depend on the size of the deposition chamber. For example, the overall flow rate may vary between about 1,000 and 20,000 sccm for a 195-liter Vector PECVD chamber. Generally, flow rates are scalable with a volume of the process chamber. Several different cleaning reagents may be simultaneously introduced into a remote plasma generator unit for at least a part of the entire processing time. For example, the overall cleaning process may involve several stages with varying flow rates, different cleaning reagents and inert gases introduced and discontinued at different times, varying pressure and plasma generation power levels, and stage durations. Additional details on cleaning stages used in the plasma cleaning method are provided in the context of FIG. 3.

In a remote plasma generator some cleaning reagent molecules are activated to form cleaning reagent radicals, ions, high energy atom and molecules, which are collectively referred to as "activated species" (block 204). Activated species are more reactive with residues than the original cleaning reagents containing stable cleaning reagent molecules. Remote plasma generators provide high degree of dissociation of reagent molecules into activated species, usually 90% and higher. Still some molecules may pass through a remote plasma generator without being activated. Many activated species may return to their stable form, such as recombination of radicals back into the molecules before reaching the deposition chamber. A combination of cleaning reagent molecules and activated species is generally referred to as a cleaning reagent mixture, a cleaning mixture, or simply a mixture. It should be readily understood that the cleaning mixture has varying relative concentrations of activated species and stable cleaning reagent molecules in different locations of the overall cleaning system. The concentration of activated species (radicals, ions, and high energy atoms and molecules) may be as high as 90% at exit of the remote plasma generator, and then may gradually decrease before reaching the deposition chamber and the residue surfaces inside the chamber. The concentration of activated species is then increased inside the deposition chamber with the help from in-situ plasma generation, as described below.

After passing through the remote plasma generator the cleaning reagent mixture is then introduced into the deposition chamber (block 206), which involves flowing the mixture through the line connecting the remote plasma generator and the deposition chamber and then coming into the deposition chamber through a shower head or other chamber opening areas. The concentration of activated species continues to drop. For example, recombination of cleaning reagent radicals in the mixture may rapidly occur while the mixture is being delivered. Recombination depends on the delivery pressure, materials of the delivery line, length, diameter, curvature, surface area and temperature of the delivery line, and deposition chamber conditions. Moreover, various cleaning reagents may exhibit different recombination behaviors. For example, oxygen cleaning reagents tend to show poor performance in remote plasma cleaning methods due to rapid recombination of oxygen radicals despite a high degree of initial dissociation externally.

Once the cleaning reagent mixture is introduced into the deposition chamber, it reaches the exposed interior surfaces of the deposition chamber (block 208), and an in-situ plasma is struck simultaneously to increase the concentration of reactive etch radicals. While most of the mixture is directed towards the wafer pedestal by the shower head, some of it reaches other surfaces as well. The overall process may include several cleaning stages designed to target different parts of the deposition chamber and have varying chamber pressure, cleaning reagent compositions, power levels of in-situ plasma generation, and durations.

In-situ plasma generation may serve several purposes during introduction of the cleaning reagent mixture. First, the molecules that have not dissociated in the remote plasma generator or ones that has already recombined or generally "de-activated" upon entering the deposition chamber may be activated and "re-activated" by the in-situ plasma. In certain embodiments, the in-situ plasma generator used in the methods describes herein may be set to lower power levels than in conventional in-situ cleaning methods because of the enhanced etch resulting from the synergy effect of in-situ and remote clean methods. The composition of the cleaning reagents may also be adjusted to include more cleaning reagents that are prone to recombine, such as oxygen, and less aggressing cleaning reagents that are damaging to the equipment, such as fluorine. Second, in-situ plasma increases ionized species concentration and provides additional ion bombardment energy to assist in the breakdown and dissociation of deposited residues. Furthermore, in-situ plasma heats up the inside surfaces of the deposition chamber including the areas with residues leading to faster etch rates and more desirable volatile reaction products. A wafer pedestal may be separately heated using its internal heater and kept at between about 100° C. and 650° C. during the entire cleaning process. In a more specific embodiment, the pedestal may be kept between about 250° C. and 550° C.

As indicated above, in certain embodiments, the in-situ plasma generator may be set to lower power levels than required in conventional in-situ plasma cleaning methods. In certain embodiments, this is true even when some or most of the radical species generated remotely have recombined prior to introduction into the deposition chamber. One mechanism that permits this is radicals recombining into high energy molecules prior to introduction into the deposition chamber. Although the radicals are recombined, the energy necessary to dissociate them is less than what it would be if entering the chamber without previously passing through the remote plasma generator.

The cleaning reagent mixture then reacts with the residues (block 210) to form volatile compounds that are evacuated from the chamber (block 212). For example, high carbon content ashable hard mask residues may form volatile carbon oxides (CO and $CO_2$), carbon fluorides ($CF_4$, $C_2F_4$, $C_2F_6$ and others) and etch products. The underlying $SiO_2$ film is also etched away by fluorine radicals. The remaining un-reacted mixture, inert gases, and volatile compounds are pumped out of the chamber.

Figure 3:
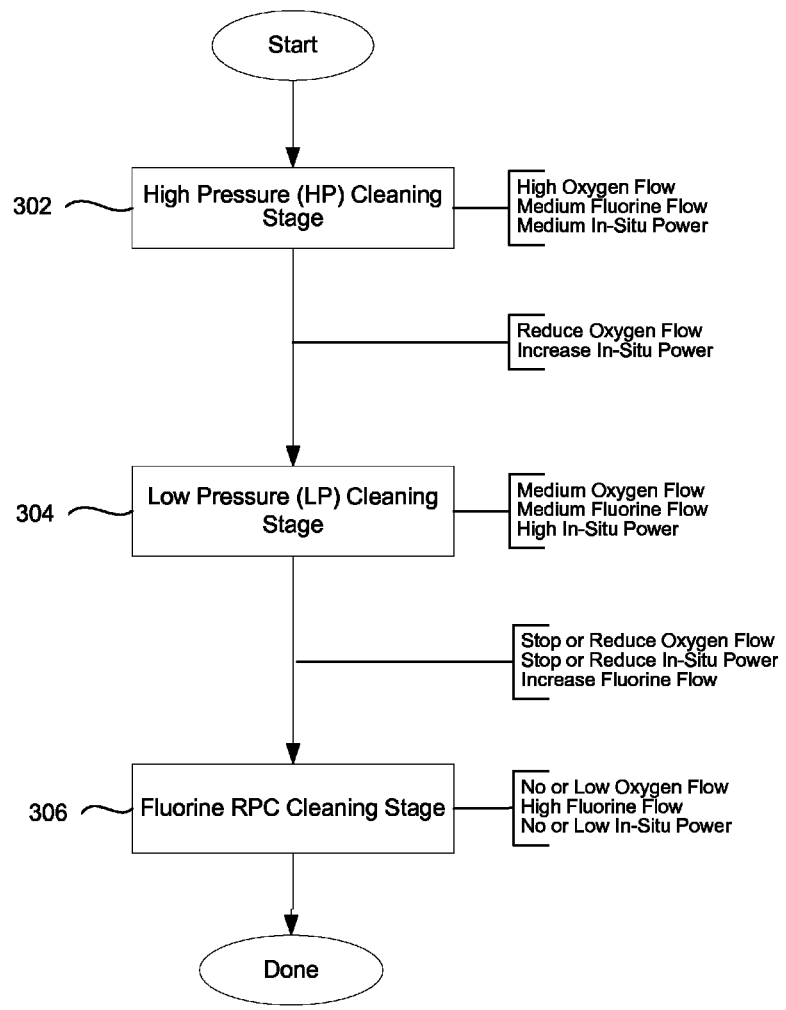
FIG. 3 illustrates various stages in a plasma cleaning method for removal of residues from the inside surfaces of deposition chambers in accordance with one embodiment of the present invention.

The overall cleaning process may include multiple stages, each stage designed to clean different parts of the chamber and/or different residues. One embodiment having three cleaning stages is illustrated in FIG. 3. The method includes: a high pressure (HP) cleaning stage (block 302), a low pressure (LP) cleaning stage (block 304), and fluorine RPC cleaning stage (block 306). The HP cleaning stage is typically performed at higher pressure levels and uses more oxygen containing compound. Such combination allows for faster but non-destructive cleaning of the showerhead and the pedestal. Aluminum is a common material for showerheads and tends to form aluminum fluoride during long and aggressive cleaning at high temperature and high fluorine containing compounds' flow rates. During the HP stage the oxygen containing compounds effectively dilute the fluorine containing compounds and diminish destructive effect of the fluorine containing compounds. Because of the high pressure and high flow rates, the HP stage may be substantially shorter than the LP stage, which is typically performed at lower pressure and lower overall flow rate. During the LP stage, the flow rate of the oxygen containing cleaning reagents is reduced, thereby, increasing the concentration of the fluorine containing cleaning reagents. The power level of in-situ plasma generation can be raised to increase the etch rate, while the pressure is decreased. The LP stage is usually the longest duration stage to allow for cleaning reagents to reach remote areas of the chamber, such as under the pedestal, around the chamber top plate, and the chamber walls. In addition to removing carbon containing residues, some silicon oxide residues on the showerhead and pedestal may be also removed by fluorine radicals. Finally, the pure fluorine RPC clean stage may be performed using only the fluorine containing cleaning reagents and requires no in-situ power generation. The focus is on removing the remaining silicon oxide residue and, thus, oxygen containing cleaning compounds may not be needed. Additionally, fluorine radicals do not recombine as rapidly as oxygen radicals, and in-situ plasma generation may be discontinued to prevent damage to the exposed aluminum chamber components after most of the deposition residues have been removed. The stage can be performed at a pressure higher than the LP stage and may be close to the pressure level of the HP stage. Note that an RPC unit is used in all three stages. In certain embodiments, the unit automatically adjusts the power settings depending on the flow rate and pressure of the cleaning gases. However, the in-situ plasma is only used during the HP cleaning and the LP cleaning stages so that the damage to chamber hardware parts is minimized. According to various embodiments, the HP, LP and fluorine RPC cleaning stages may be performed in different orders than that presented in FIG. 3.

The following parameters may be used in a cleaning method according to the embodiment presented in FIG. 3 for removal of high carbon content residues. However, it should be readily understood that the described stages and some parameters may be also applicable to clean other residue materials. The HP cleaning stage (302) is performed for between about 100 seconds and 1,000 seconds, while the chamber pressure of between about 0.25 Torr and 4 Torr. It should be understood that the duration of the stages may depend on the amount of residue present in the chamber. The in-situ generator may be set to provide between about 500-4,000 W. The cleaning reagent mixture is primarily composed (and may consist essentially) of oxygen containing compounds during this stage. The flow rate may vary between about 1,000 sccm and 15,000 sccm, or in more specific embodiment between about 3,000 sccm and 10,000 sccm, for a Vector deposition chamber with four deposition stations. Because of high level of activation of the cleaning reagents in a remote plasma generator with further activation inside the deposition chamber, oxygen containing cleaning compounds may provide effective initial cleaning of the shower head and the wafer pedestal. The flow rate of fluorine containing cleaning compounds may be at least ten times less than that of oxygen containing cleaning compounds. In other embodiments, the ratio may be between about 2 and 5. In one specific embodiment, the flow rate of the fluorine containing cleaning compounds is between about 100 and 500 sccm for a Vector deposition chamber.

During the LP cleaning stage the pressure is reduced to between about 0.05 Torr and 1 Torr, while the RF power is increased to between about 1,000 W and 5,000 W. The flow rate of the oxygen containing cleaning compounds may be also reduced for this stage. For example, a flow rate of between about 200 sccm and 5,000 sccm may be used for oxygen containing cleaning compounds in a Vector deposition chamber. The flow rate of the fluorine containing compounds may be kept the same. The goal of this cleaning stage is to reach the remote areas of the deposit chamber, such as the side walls and a top plate above the showerhead and the surfaces under the wafer pedestal. It usually requires a longer period, so that the LP cleaning stage may proceed for between about 200 seconds and 2,000 seconds. Additionally, some of the silicon dioxide residues may be etched away during this stage because high concentration of fluorine radicals is present in the chamber. Usually, ashable hard mask residues are completely removed from the deposition chamber at the end of the LP stage.

Finally, the fluorine RPC cleaning stage may be used to remove any silicon dioxide under the ashable hard mask residues. This stage involves a high flow rate of fluorine containing compounds, for example between about 1,000 sccm and 8,000 sccm for a Vector deposition chamber, while no or relatively small amount of the oxygen containing compounds are used. The in-situ plasma generation is usually turned off or set to a very low power level. In-situ plasma generation is less critical during this stage because fluoride containing compounds are primarily used and fluorine radicals are less prone to recombine than oxygen radicals. Furthermore, the inside surfaces of the deposition chamber may have already been pre-heated by two prior stages. The chamber pressure may be between about 0.25 Torr and 4 Torr, while the duration of this stage may be between about 50 seconds and 500 seconds. The table below summarizes various parameter ranges for different stages of the cleaning process described above.

TABLE 1

|  | HP Cleaning | LP Cleaning | Fluorine RPC |
| --- | --- | --- | --- |
| Fluorine Containing Compound Flow Rate (sccm) | 100-500 | 100-500 | 1,000-8,000 |
| Oxygen Containing Compound Flow Rate (sccm) | 1,000-15,000 | 200-5,000 | 0-500 |
| Inert Gas (sccm) | 200-5,000 | 200-5,000 | 3,000-20,0000 |
| RF Power Level (W) | 500-4,000 | 1,000-5,000 | 0-1,000 |
| Pressure (Torr) | 0.25-4 | 0.05-1 | 0.25-4 |
| Time (sec) | 100-1,000 | 200-2,000 | 50-500 |

The process parameters for a more specific embodiment are presented in the table below.

TABLE 2

|  | HP Cleaning | LP Cleaning | Fluorine RPC |
| --- | --- | --- | --- |
| Fluorine Containing Compound Flow Rate (sccm) | 200-400 | 300-400 | 3,000-5,000 |
| Oxygen Containing Compound Flow Rate (sccm) | 4,000-8,000 | 1,000-2,000 | 0-100 |
| Inert Gas (sccm) | 750-1,250 | 750-1,250 | 6,000-12,0000 |
| RF Power Level (W) | 1,000-2,000 | 2,000-3,000 | 0-500 |
| Pressure (Torr) | 0.75-1.25 | 0.1-0.5 | 0.75-1.25 |
| Time (sec) | 200-500 | 300-800 | 60-200 |

Apparatus

Any suitable deposition chamber may be cleaned using the plasma cleaning method. Examples of deposition apparatuses include Novellus's Sequel PECVD system, Vector PECVD system, Vector Extreme PECVD system, which are all available from Novellus Systems, Inc. of San Jose, Calif., or any of a variety of other commercially available processing systems. In some cases, depositions performed on multiple deposition stations sequentially. Each station may be cleaned by the methods described above.

Figure 4:
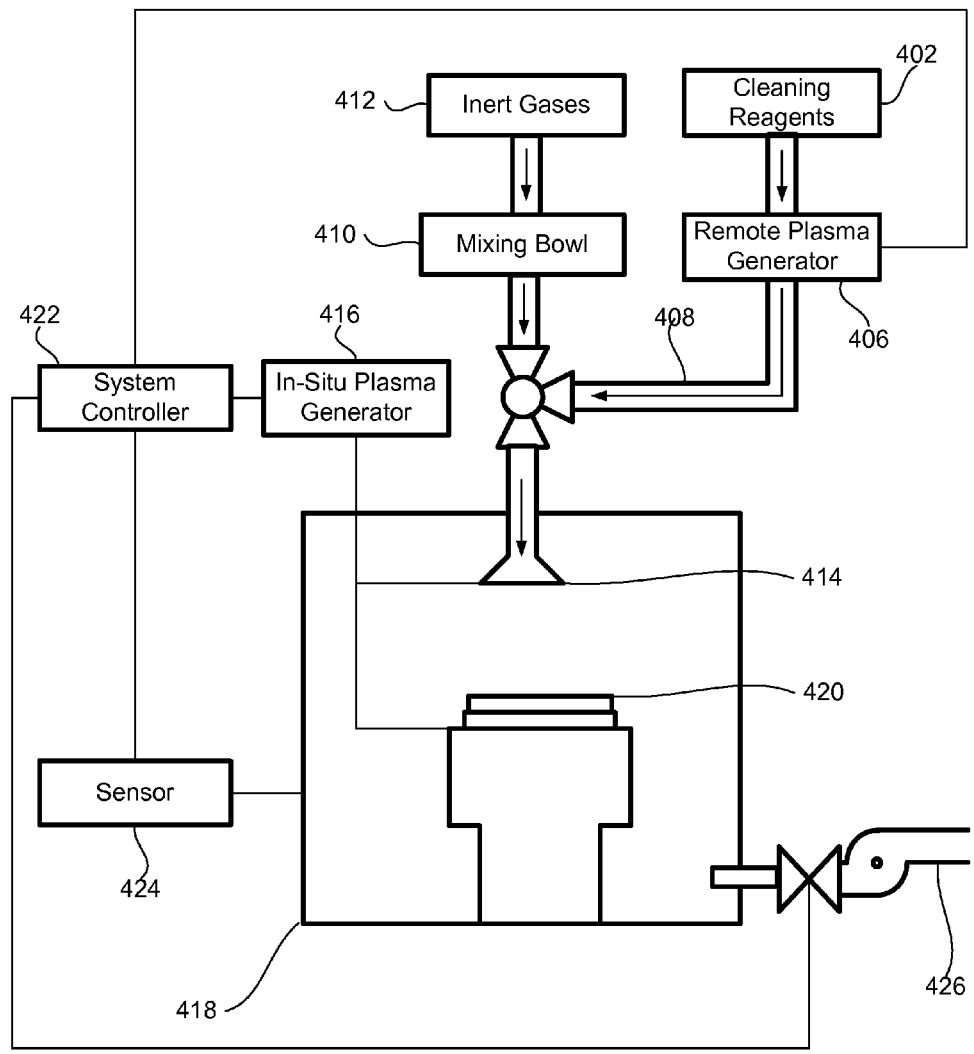
FIG. 4 presents a general block diagram depicting various hardware elements of a deposition chamber and a corresponding cleaning apparatus for implementing the plasma cleaning method in accordance with one embodiment of the present invention.

FIG. 4 illustrates an overall system that may be conceptually divided into a deposition chamber 418 and a cleaning apparatus including a remote plasma generator 406. The deposition chamber 418 includes a wafer pedestal 420, a shower head 414, an RF generator 416, a control system 422 and other components described below.

The cleaning reagents and inert gases, such as argon, helium and others, are supplied to the remote plasma generator 406 from various cleaning reagent sources, such as source 402. A cleaning reagent source may be a storage tank containing one or a mixture of reagents. Moreover, a facility wide source of the cleaning reagents may be used.

Any suitable remote plasma generator may be used for initial processing of the cleaning reagents. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used An RPC unit is typically a self-contained device generating weakly ionized plasma using the supplied cleaning reagents. Imbedded into the RPC unit a high power RF generator provides energy to the electrons in the plasma. This energy is then transferred to the neutral cleaning reagent molecules leading to temperature in the order of 2000K resulting in thermal dissociation of the cleaning reagents. An RPC unit may dissociate more than 90% of incoming cleaning reagent molecules because of its high RF energy and special channel geometry causing the cleaning reagents to adsorb most of this energy.

The cleaning reagent mixture is then flown through a connecting line 408 into the deposition chamber 418, where the mixture is distributed through the shower head 414. The shower head 414 or the pedestal 420 typically has an internal RF generator 416 attached to it. In one example, it is a High Frequency (HF) generator capable of providing between about 0 W to 10,000 W at frequencies 1 MHz to 100 MHz. In a more specific embodiment, the HF generator may deliver 0 W to 5,000 W at 13.56 MHz. The RF generator 416 generates in-situ plasma that is used to further dissociate cleaning reagent molecules in the mixture and to supply ion bombardment energy to enhance the cleaning process. The methods of the invention are not limited to RF-generated plasmas, but may employ microwave and other types of plasmas.

The chamber 418 may include sensors 424 for sensing various materials and their respective concentrations, pressure, temperature, and other process parameters and providing information on reactor conditions during the clean to the system controller 422. Examples of chamber sensors that may be monitored during the clean include mass flow controllers, pressure sensors such as manometers, thermocouples located in pedestal. Sensors 424 may also include an infra-red detector or optical detector to monitor presence of gases in the chamber and control measures.

Cleaning of residue generates various volatile species that must be removed from the chamber 418. Moreover, the chamber 418 needs to operate at certain pressure levels, which may different from one cleaning stage to another. The volatile etching products and other excess gases are removed from the reactor 418 via an outlet 426 that may be include a vacuum pump and a valve.

In certain embodiments, a system controller 422 is employed to control process conditions during the clean. The system controller 422 will typically include one or more memory devices and one or more processors. The processor may include a CPU or computer, analog and/or digital input/output connections, stepper motor controller boards, etc. Typically there will be a user interface associated with system controller 422. The user interface may include a display screen, graphical software displays of the apparatus and/or process conditions, and user input devices such as pointing devices, keyboards, touch screens, microphones, etc.

In certain embodiments, the system controller 422 controls the pressure in the reactor. The system controller 422 may also control all of the activities during the cleaning process, including gas flow rate and RF generator process parameters. The system controller 422 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the inventive deposition processes. Examples of programs or sections of programs for this purpose include process gas control code, pressure control code, and plasma control code.

The controller parameters relate to process conditions such as, for example, timing during each stage, chamber pressure during each stage, process gas composition and flow rates, plasma conditions such as RF power levels and RF frequency, and chamber temperature. These parameters are provided to the user in the form of a recipe, and may be entered utilizing the user interface. Signals for monitoring the process may be provided by analog and/or digital input connections of the system controller 422. The signals for controlling the process are output on the analog and digital output connections of the deposition apparatus.

A chamber pressure profile program may include program code for controlling the chamber pressure during each stage of the cleaning process by regulating, e.g., a throttle valve in the exhaust system of the chamber 426. A stage timing program may include a code for changing pressure based on the amount of carbon oxides in the chamber and/or user input and/or predetermined timing sequences. A process gas control program may include code for controlling gas composition and flow rates. A plasma control program may include code for setting RF (or other plasma source power) power levels applied to the RF plasma generator.

Example 1

An experiment was conducted to compare effectiveness of etching an ashable hard mask film from the wafer surface using a cleaning method versus an in-situ cleaning method. Standard 300-mm wafers with 5,500 Å ashable hard mask film were divided into four separate groups. Each group was etched for about 30 seconds in a Vector PECVD deposition chamber using four different clean conditions. To evaluate effect of certain process parameters, the same temperature of about 350° C., the same pressure of about 0.45 Torr, and the same cleaning reagents were used for all groups. Nitrogen trifluoride was flown at 300 sccm and oxygen was flown at 6,000 sccm in all tests. The two cleaning reagents were flown simultaneously at the constant flow rates indicated above during the entire cleaning test. The process conditions were selected for comparison purposes only and were not representative of the optimal process parameters evaluated in the experiments below.

Figure 5:
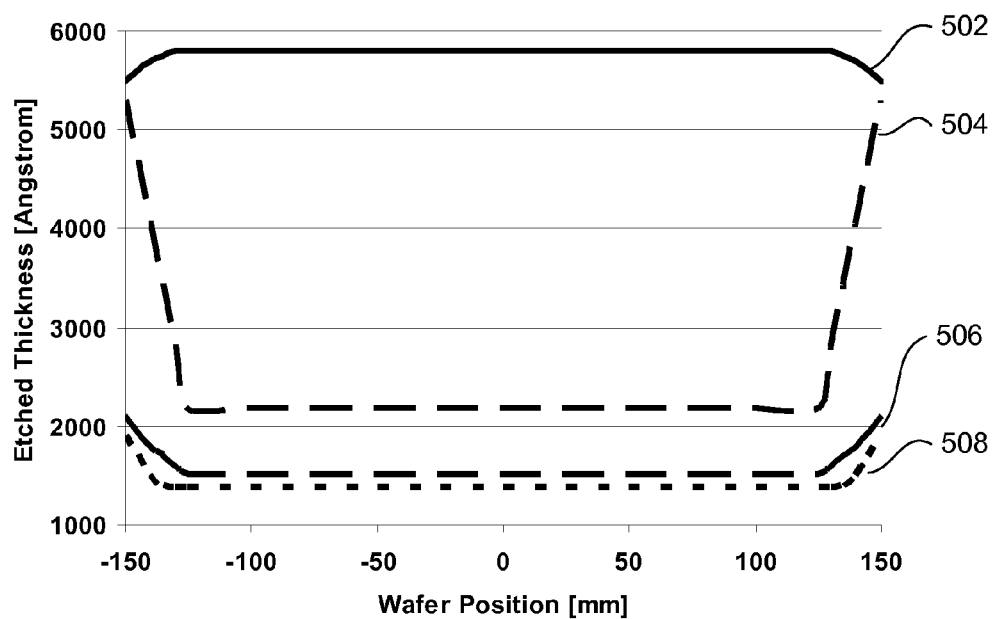
FIG. 5 is a plot illustrating experimental data of the etched thicknesses of ashable hard mask films from the surfaces of 300 mm wafers that were subjected to different cleaning conditions of four cleaning methods for about 30 seconds.

FIG. 5 is a plot illustrating experimental data of the etched thicknesses of ashable hard mask films according to each of the processes: The top solid line 502 represents the etched thickness of the ashable hard-mask deposit across the entire wafer width of 300 mm using an embodiment of the clean method described above with reference to FIG. 2. The cleaning reagents were first flown through the ASTRON® hf-s Type unit and then into the PECVD chamber. The HF generator was set to deliver about 300 W at 13.56 MHz. The entire ashable hard mask deposit was essentially removed from the wafer surface exposing the under-laying silicon. The etch rate was estimated to be at least 1.1 µm/min and possibly much higher.

For comparison, lines 504, 506 and 508 show results from different in-situ only clean processes. The bottom dashed line 508 represents the etch thickness using an in-situ only clean method with the HF generator set at 300 W to match the settings of the cleaning method described above with reference to the results shown in line 502. It was estimated that the etched thickness for this second group was only 1,400 Å, which corresponds to an etch rate of about 0.28 µm/min. Therefore, the cleaning performance of the in-situ cleaning method was determined to be approximately four times worse than that of the inventive cleaning method. Adding an RPC unit to dissociate cleaning reagents before introducing into the deposition chamber for an in-situ like clean indicates substantial improvement in cleaning.

Higher power levels of the HF generator were used for the next two in-situ cleaning groups. The second dashed line from the bottom 506 corresponds to the etched thickness for the in-situ cleaning where the HF generator was set to about 500 W. The average etched thickness was estimated at about 1,500 Å, i.e. 0.30 µm/min etched rate. Even further increasing power of the HF generator did not provide cleaning efficiency that is comparable to that of the new method. The next dashed line 504 corresponds to the etched thickness of about 2,200 Å, i.e. 0.44 µm/min etch rate, where the RF generator was set to deliver about 1500 W. Still the cleaning method with the 300 W setting was almost three times more effective than any of the in-situ cleaning conditions tested. Note that higher RF power is not desirable because of the destructive effects on the internal components of the deposition chamber.

Example 2

Yet another experiment was conducted to using a Vector PECVD chamber. First, a set of ashable hard mask depositions was conducted to build up the film accumulation inside the chamber. Fifty wafers were deposited with approximately 5,500 Å thick ashable hard mask film at 350° C. The chamber was then cleaned using one of several proposed cleaning methods. An in-situ cleaning method with the clean parameters listed in the table below. A total of 26 min cleaning time to achieve adequate cleanness of the chamber, i.e. lack of any visible residues.

TABLE 3

|  | HP Clean | HP Clean 2 | LP Clean |
|---|---|---|---|
| NF$_3$ Flow Rate (sccm) | 600 | 1000 | 400 |
| O$_2$ Flow Rate (sccm) | 6000 | 1500 | 1500 |
| He Flow Rate (sccm) | 0 | 3000 | 0 |
| HF Power Level (W) | 4000 | 3000 | 3250 |
| Pressure (Torr) | 1.0 | 1.5 | 0.25 |

The results of the in-situ cleaning were compared to results of several runs using a cleaning method. Three different settings were tested for the HF generator during the low pressure cleaning stage. The process parameters for the cleaning method are summarized in table below.

TABLE 4

|  | HP Clean | LP Clean | Fluorine RPC |
|---|---|---|---|
| NF$_3$ Flow Rate (sccm) | 300 | 300 | 4000 |
| O$_2$ Flow Rate (sccm) | 6000 | 1500 | 0 |
| Argon Flow Rate (sccm) | 1000 | 1000 | 9000 |
| HF Power Level (W) | 1500 | 1000/1500/2000 | 0 |
| Pressure (Torr) | 1 | 0.25 | 1 |

With 1.0 kW setting during the LP cleaning stage the chamber was effectively cleaned in about 20 min achieving approximately 6 min saving over the in-situ cleaning. Increase the power to 1.5 kW saved additional 2 min. Finally, setting the HF generator to 2.5 kW led to the overall cleaning time of about 16 min or about 10 minutes (~38%) of total savings over the in-situ cleaning method. Further increasing the power level may have allowed even shorter cleaning time.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of cleaning a residue from interior surfaces of a semiconductor deposition chamber, the method comprising:

a first stage comprising:
(a) introducing a first set of one or more cleaning reagents into a remote plasma generator, the first set of one or more cleaning reagents comprising a first amount of an oxygen containing compound and a first amount of a fluorine containing compound;
(b) generating activated species from the introduced cleaning reagents in the remote plasma generator by delivering a first plasma energy to the cleaning reagents;
(c) introducing a cleaning mixture into the deposition chamber, wherein the cleaning mixture comprises the activated species; and
(d) exposing the interior surfaces of the deposition chamber to the cleaning mixture while delivering a second plasma energy by applying a power to the deposition chamber to the cleaning mixture for at least one period of time from an in-situ plasma generator;

a second stage comprising:
(f) introducing a second set of one or more cleaning reagents into the remote plasma generator, the second set of one or more cleaning reagents comprising a second amount of an oxygen containing compound and a second amount of a fluorine containing compound, wherein a ratio of the first amount of the fluorine containing compound to the first amount of the oxygen containing compound is less than a ratio of the second amount of the fluorine containing compound to the second amount of the oxygen containing compound;

wherein the deposition chamber pressure during the first stage is greater than the deposition chamber pressure during the second stage, and wherein the applied power in the first stage is less than the applied power during the second stage such that the second plasma energy in the first stage is less than the second energy during the second stage.

2. The method of claim 1, wherein the residue is a carbon containing residue.

3. The method of claim 1, wherein the residue is formed during deposition of an ashable hard mask film.

4. The method of claim 1, where the residue comprises silicon oxide.

5. The method of claim 1, wherein generating the activated species comprises forming radicals.

6. The method of claim 1, wherein the delivering of the second plasma energy generates additional activated species inside the deposition chamber.

7. The method of claim 1, wherein the first stage is performed at a chamber pressure of at least about 0.6 Torr and the second stage performed at a chamber pressure of no more than about 0.6 Torr.

8. The method of claim 7, wherein the first stage is performed prior to the second stage.

9. The method of claim 7, wherein a flow rate of the oxygen containing compound is at least ten times greater than a flow rate of the fluorine containing compound during the first stage and at least three times greater during the second stage.

10. The method of claim 7, wherein the second plasma energy is delivered at between about 1,000 W and 2,000 W during the first stage and at between about 2,000 W and 3,000 W during the second stage.

11. The method of claim 7, wherein an etch rate of a carbon containing residue around or on a pedestal surface kept at about 150 degrees Centigrade is at least 1 micron per minute during the first stage.

12. The method of claim 1, wherein reacting the residue with the cleaning mixture is performed while a pedestal of the deposition chamber is kept at between about 250 degrees Centigrade and 550 degrees Centigrade.

13. The method of claim 1, wherein delivering the second plasma energy to the cleaning reagents comprises re-dissociating recombined molecules to form radicals.

14. The method of claim 1, further comprising a third stage comprising:
(h) introducing a third set of one or more cleaning reagents into the remote plasma generator, the third set of one or more cleaning reagents comprising a third amount of a fluorine containing compound and substantially no oxygen containing compound; and
(i) repeating operations (b) and (c) using the third set of one or more cleaning reagents.

15. The method of claim 14, wherein the third stage is shorter than the second stage.

16. The method of claim 14, wherein the in-situ plasma generator is turned off during the third stage.

* * * * *